(12) United States Patent
Segev et al.

(10) Patent No.: US 9,327,324 B2
(45) Date of Patent: May 3, 2016

(54) METHOD AND SYSTEM FOR CLEANING A VACUUM CHAMBER

(71) Applicant: Applied Materials Israel Ltd., Rehovot (IL)

(72) Inventors: Lior Segev, Rehovot (IL); Irit Ruach Nir, Rehovot (IL); Guy Eitan, Kidron (IL)

(73) Assignee: Applied Materials Israel Ltd., Rehovot (IL)

( * ) Notice: Subject to any disclaimer, the term of this patent is extended or adjusted under 35 U.S.C. 154(b) by 67 days.

(21) Appl. No.: 13/777,044

(22) Filed: Feb. 26, 2013

(65) Prior Publication Data

US 2014/0238438 A1 Aug. 28, 2014

(51) Int. Cl.
| | |
|---|---|
| *B08B 6/00* | (2006.01) |
| *B08B 7/00* | (2006.01) |
| *H01J 37/02* | (2006.01) |
| *H01J 37/20* | (2006.01) |
| *H01J 37/32* | (2006.01) |

(52) U.S. Cl.
CPC . *B08B 7/00* (2013.01); *H01J 37/02* (2013.01); *H01J 37/20* (2013.01); *H01J 37/32862* (2013.01); *H01J 2237/006* (2013.01); *H01J 2237/022* (2013.01)

(58) Field of Classification Search
None
See application file for complete search history.

(56) References Cited

U.S. PATENT DOCUMENTS

| | | | | |
|---|---|---|---|---|
| 5,312,519 | A * | 5/1994 | Sakai et al. | 134/1.1 |
| 2002/0179247 | A1 | 12/2002 | Davis et al. | |
| 2006/0090700 | A1* | 5/2006 | Satoh et al. | 118/715 |
| 2009/0314939 | A1* | 12/2009 | Stern et al. | 250/309 |

FOREIGN PATENT DOCUMENTS

GB 2 358 955 A 8/2001

OTHER PUBLICATIONS

European Search Report for European Patent Application No. 13176629.7, mailed Nov. 15, 2013, 3 pages.

\* cited by examiner

*Primary Examiner* — Eric Golightly

(74) *Attorney, Agent, or Firm* — Kilpatrick Townsend & Stockton LLP

(57) ABSTRACT

A system and method are described, for use in cleaning of a vacuum chamber. The method comprising connecting a vacuum chamber to a plasma generating unit via a plasma connection port and connecting the vacuum chamber to a high vacuum pumping unit via a pumping port. A flow conductance through the plasma connection port to the vacuum chamber is controlled to limit passage of charged particles and cleaning substances produced in the plasma generating unit, to thereby maintain a working pressure inside the vacuum chamber while cleaning the vacuum chamber by said cleaning substances.

11 Claims, 4 Drawing Sheets

METHOD AND SYSTEM FOR CLEANING A VACUUM CHAMBER

TECHNOLOGICAL FIELD

This invention relates to a technique of cleaning a vacuum chamber, in particular a chamber of an electron microscope system.

BACKGROUND

Vacuum chambers are widely used in various applications for providing interruption-free environment for analytical processes. For example, a typical electron microscope operates to inspect a sample placed in a vacuum chamber, e.g. at a typical pressure of $P_v \approx 10^{-5}$-$10^{-6}$ Torr. At such low pressures many materials behave as volatile substances and may produce vapor which might contaminate sample or samples located within the chamber. For example, evaporated Hydrocarbon (HC) molecules, typically originating from various oils used for lubricating moving platforms within a vacuum chamber, often adsorb on the chamber's walls and contaminate samples which are located in the chamber (even for a short time).

Some conventional techniques for reducing the amount of contaminating molecules within a vacuum chamber utilize injection of free radicals (and especially Oxygen radicals) into the chamber. These techniques utilize plasma generating systems producing appropriate free radicals which can operate at pressures of $2 \cdot 10^{-4}$ Torr and generate radical, e.g. atomic Oxygen ($O^0$) particles, which react with contaminates in the vacuum chamber and enable evacuation thereof.

GENERAL DESCRIPTION

There is a need in the art for a novel approach and cleaning technique for removing various contaminates, in particular hydrocarbon molecules, from vacuum chambers. Additionally, there is a need in the art for cleaning techniques enabling continuous evacuation of contaminates from the vacuum chamber while allowing operation of various processes within the vacuum chamber.

The conventional techniques for cleaning vacuum chambers from contaminating molecules, and in particular from hydrocarbon (HC) molecules, utilizing Air plasma including Oxygen radicals (neutral oxygen atoms), typically operate at pressures significantly higher than the operation pressure for most vacuum-based inspection applications. Moreover, the generated air plasma often includes charged particles, e.g. free electrons and/or ions, which may cause short-circuit and thus damage electronic elements located within the vacuum chamber. Thus, the conventional plasma based cleaning techniques require shutting down of operating elements, increasing the pressure within the chamber and only then connecting the plasma generator and proceed with cleaning the chamber.

The technique of the present invention utilizes the control of material flow rate from the plasma generating unit into the vacuum chamber. An appropriate flow rate is selected that allows for maintaining a steady state working pressure in a vacuum chamber while flowing cleaning substances from the plasma generating unit thereto. Additionally, the technique of the invention is capable of eliminating, or at least significantly reducing, leakage of charged particles (electrons and/or ions) into the vacuum chamber thus preventing electronic damage to devices within the chamber. This allows for continuous operation of the plasma generating unit for injection of oxygen radicals generated therein into the chamber, while operation of processes, e.g. inspection processes, within the chamber may proceed.

The control of the material flow rate and maintaining of steady state working pressure is achieved in the invention by providing a barrier located in the path of (air) plasma flow from the plasma generating unit into the vacuum chamber. The barrier is configured to appropriately limit passage of the material/particles (charged particles and cleaning substances) from the plasma generating unit into the vacuum chamber and thus provide appropriate pressure profile within a connection channel/port between the two units while preserving a desired working pressure in the vacuum chamber. The connection channel actually creates an additional effective flow volume (flow line) between the plasma generating unit and the vacuum chamber, and the barrier at the output of this effective glow line and thus at the input into the vacuum chamber appropriately limits material flow into the vacuum chamber. Geometrical parameters of the barrier are selected to provide appropriate flow conductance which, in combination with pumping of the vacuum chamber, keeps the vacuum chamber at an appropriate pressure range around a predetermined pressure, which is sufficient for its operation (i.e. working pressure), while the plasma generating unit operates at a different (typically higher) operating pressure. It should be understood that the invention actually controls a difference between the output pressure of the plasma generating unit (a typical pressure of material flowing from the plasma generating unit) and the working pressure to be maintained in the vacuum chamber. More specifically, for a given desired working pressure in the vacuum chamber, the barrier is configured with an appropriate aperture diameter to allow a pressure difference between the main chamber and the plasma chamber, such that the plasma pressure is adequate to sustain the working pressure in the vacuum chamber while being evacuated by the corresponding pump.

Additionally, the inventors have found that by making the barrier from an electrically conductive material composition, and providing electrical grounding of the barrier, the barrier limits (e.g. substantially prevents) charged particles from passing into the vacuum chamber.

The barrier actually defines an aperture arrangement (at least one aperture) for material flow from the plasma generating unit and the vacuum chamber, and is preferably an apertured (perforated) electrically conductive (e.g. metallic) plate. The aperture(s) may be of any shape, e.g. circular, polygonal or any other cross-section, and the aperture arrangement has a size selected to provide desired flow conductance for a given flow of particles passing therethrough from the plasma generating unit (with the first pressure) into the vacuum chamber (where second pressure is to be maintained). It should be understood that a size of the aperture arrangement is defined by that of a number of apertures used. The thickness of the barrier (plate-like element) may be of the order of a few millimeters, or higher e.g. about a few centimeters. The barrier plate may be of any electrically conductive material, and the term "metallic plate" at times used herein should thus be interpreted broadly. The barrier plate is preferably made of relatively corrosion resistant material(s) such as stainless steel or noble metals. Generally, any other electrically conductive material, and in particular metals, e.g. aluminum, may be used, while corrosion might reduce the lifetime of the barrier and thus cause a need to replace it often.

It should be understood that the barrier is incorporated in a plasma input port of the vacuum chamber. For example, the vacuum chamber's wall is made with appropriate aperture arrangement coupled to the output of the plasma generating unit. Alternatively, the barrier is a separate element installed at the plasma input port of the vacuum chamber, e.g. in a pipe coupling the vacuum chamber to the output of the plasma generating unit.

As indicated above, the barrier is configured to provide a predetermined flow conductance for given particles passing therethrough. The predetermined flow conductance may be selected to provide a desired steady state pressure values in the vacuum chamber while flowing particles from the plasma generating unit into the chamber. A typical value of the barrier's flow conductance is selected in accordance with the desired pressure difference, and a pumping rate evacuating gas from the vacuum chamber.

Thus, according to one broad aspect, the present invention provides a method for use in cleaning of vacuum chambers, the method comprising connecting a vacuum chamber to a plasma generating unit via a plasma connection port and to a high vacuum pumping unit via a pumping port, and controlling a flow conductance through the plasma connection port to the vacuum chamber for charged particles and cleaning substances produced in the plasma generating unit, to thereby maintain a working pressure inside the vacuum chamber while cleaning the vacuum chamber by said cleaning substances.

According to some embodiments of the present invention, said controlling of the flow conductance for the charged particles and cleaning substances comprises determining a steady state pressure difference between the working pressure of the vacuum chamber and a pressure in the plasma generating unit, and selecting one or more parameters of a barrier plate in said plasma connection port through which said cleaning substances are to flow to the vacuum chamber, to thereby provide a desired flow rate for the cleaning substances into the vacuum chamber. Said one or more parameters may comprise at least a dimension of an aperture in said barrier plate corresponding to the desired flow rate. The dimension of said aperture may be between 1 to 3 millimeters, the working pressure being in a micro-Torr range and the pressure in the plasma generating unit being at least in a mili-Torr range. The aperture may be cylindrical and may be oriented parallel to direction of propagation of flow of said cleaning substances or with a certain non-zero angle from direction of propagation of said flow. The aperture may be configured with varying diameter. According to some embodiments the barrier plate may comprise plurality of apertures, number and geometrical properties of said plurality of apertures may be selected to provide a combined flow conductance providing said desired flow rate.

Selecting of the parameters of the barrier plate may comprise selecting an electrically conductive material composition and electrical condition for said barrier plate to thereby substantially prevent propagation of the charged particles into the vacuum chamber.

According to some embodiment the method comprising continuously operating the vacuum chamber under said working pressure for performing one or more processes in the vacuum chamber, and operating the plasma generating unit and the high vacuum pumping unit for cleaning said vacuum chamber by the cleaning substances flowing into the vacuum chamber from the plasma generating unit.

The method may comprise operating the high vacuum pumping unit for evacuating said vacuum chamber at a certain pumping rate S, and selecting the flow conductance of the plasma connection port such that a ratio between said flow conductance and said pumping rate is substantially similar to a ratio between the working pressure in said vacuum chamber and pressure in said plasma generating unit.

Said cleaning substances may comprise Oxygen radicals, Hydrogen radicals or other radicals generated in said plasma generating unit, for reacting with hydrocarbon contaminates within said vacuum chamber and thereby producing volatile molecules evacuated by the high vacuum pumping unit.

According to one other broad aspect of the present invention, there is provided a system for cleaning a vacuum chamber, the system comprising a plasma generating unit connected to the vacuum chamber via a plasma connection port and a high vacuum pumping unit connected to the vacuum chamber via a pumping port. Said plasma connection port comprising a barrier plate configured for defining a flow conductance through the plasma connection port to the vacuum chamber for charged particles and cleaning substances produced in the plasma generating unit, to thereby maintain a predetermined working pressure inside the vacuum chamber while cleaning the vacuum chamber by said cleaning substances.

The barrier plate may have one or more selected parameters such that said flow conductance provides a steady state of the working pressure in the vacuum chamber, said one or more parameters may comprise at least a dimension of an aperture in the barrier plate to determine a flow rate for the cleaning substances into the vacuum chamber.

The barrier plate may be made of a selected electrically conductive material composition and may have a predetermined electrical condition to thereby substantially prevent propagation of the charged particles into the vacuum chamber. In some embodiments said barrier is an electrically grounded metallic plate with the aperture therein. The dimension of the aperture may be in a range of about 0.3-1 millimeters, while the working pressure may be in a micro-Torr range and the pressure in the plasma generating unit is at least in a mili-Torr range.

According to some embodiments, the barrier plate is integral with a wall of the vacuum chamber at the plasma connection port, or it is installed across the plasma connection port.

According to yet another broad aspect of the present invention there is provided a vacuum chamber having a plasma connection port for connecting to a plasma connection unit and pumping port for connecting to a high vacuum pumping unit. Said plasma connection port comprising a barrier plate integral with a wall of the vacuum chamber and being configured to define a predetermined flow conductance therethrough into the vacuum chamber from a predetermined plasma generating unit for charged particles and cleaning substances produced in the plasma generating unit. The vacuum chamber being thereby operable under a predetermined working pressure thereinside while being cleaned by said cleaning substances flowing through said barrier.

BRIEF DESCRIPTION OF THE DRAWINGS

In order to understand the disclosure and to see how it may be carried out in practice, embodiments will now be described, by way of non-limiting example only, with reference to the accompanying drawings, in which.

DETAILED DESCRIPTION OF EMBODIMENTS

The present invention provides a technique for effectively cleaning a vacuum chamber utilizing plasma flow thereto; typically air plasma including various radicals, e.g. Oxygen radicals, Hydrogen radicals or typically any radicals which may react with contaminates and produce volatile compounds. The technique relies on providing a barrier to limit the plasma flow into the vacuum chamber and thus enable continuous operation of various processes within the vacuum chamber while being cleaned.

Figure 1A:
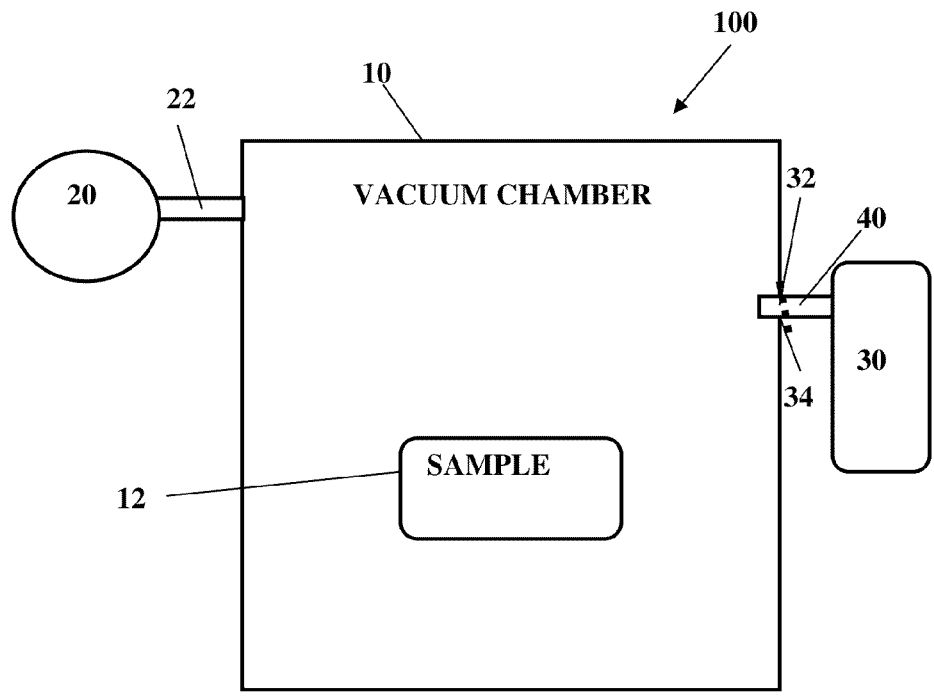
FIG. 1A is a schematic illustration of a vacuum system for certain vacuum-based processes, e.g. SEM for inspection of samples, configured according to an example of the invention.

FIG. 1A illustrates schematically a processing system 100 configured for carrying out one or more processes which require certain vacuum conditions. System 100 may be a sample inspection system, e.g. scanning electron microscope (SEM), transmitting electron microscope (TEM), focused ion beam microscope (FIB), electron beam writing system, Physical vapor deposition (PVD) system, ion-beam implant system or any other system configured to operate in high vacuum conditions. The system 100 includes a vacuum chamber 10 having pumping port 22, for connecting the vacuum chamber to a high vacuum pumping unit 20, and having a plasma port 32 for connecting to a plasma generating unit 30. In this specific not-limiting example, the vacuum chamber is shown as being used in a sample inspection/processing system, and accordingly a sample holder 12 is located within the vacuum chamber. It should be noted although not specifically shown that various other elements associated with the process(es) to be carried out by the system 100 are appropriately provided. Various processes performed by such vacuum-based system 100 and the system configuration to perform such processes, are generally known, do not form part of the invention, and therefore need not be specifically described, except to note that the system 100 utilizes the vacuum chamber interconnected between a high vacuum pumping unit and a plasma generating unit.

The plasma generating unit 30 may be any appropriate plasma generator. The plasma generating unit operates to produce appropriate radicals such as Oxygen, Hydrogen or other radicals and transmits them into the vacuum chamber 10. The radicals undergo chemical reactions with unwanted hydrocarbon (HC) molecules in the vacuum chamber and convert the HC molecules to relatively light and volatile molecules, e.g. water and carbon dioxide molecules, which can easily be pumped out of the vacuum chamber 10.

Hydrocarbon molecules often evaporate from various lubricants and oils used in devices/elements located in the vacuum chamber, such as oil used to lubricate moving platforms, e.g. sample holder 12. These molecules adsorb to the wall of the chamber 10 and may contaminate samples undergoing inspection or affect other processes within the chamber 10.

As indicated in a non-limiting manner above, the plasma generating unit 30 produces and transmits/directs oxygen radicals into the vacuum chamber for removal of the contaminating HC molecules. To generate the appropriate plasma, the plasma generating unit operates at a pressure within a certain pressure range, which is often much higher than the operation pressure of the vacuum chamber. For example, typical working pressures of plasma generators are between 2 to $10^{-2}$ and at times, some plasma generators may operate at lower pressures, i.e. down to a pressure of $10^{-4}$ Torr. This is while typical vacuum-based processes in the vacuum chamber 10 require the pressure therein to be as low as $10^{-6}$ Torr, and even lower, i.e. in the micro-Torr range. Additionally, the operation of the plasma generating unit, coupled to the vacuum chamber, typically results in that charged particles, such as electrons and ions, are directed into the chamber. These charged particles while in the chamber may cause short circuits and damage to electronic equipment within the chamber. Conventionally, these might be solved by halting all the processes in the chamber, increasing the pressure in the chamber above the operational one and thereafter connecting the chamber to the plasma generating unit for cleaning The technique of the present invention is based on varying the flow conductance parameters within the plasma connection port 32 to maintain an appropriate steady state pressure in the vacuum chamber, defining a pressure profile within the connection port and a pressure difference between that of the output pressure of the plasma generating unit and the pressure in the vacuum chamber. To limit the flow conductance within the plasma connection port 32, a barrier 34 is placed at said port between the plasma generating unit 30 and the vacuum chamber 10. It should be understood that such barrier may constitute or be a part of the plasma connection port 32. The barrier 34 is configured to limit passage of particles from the plasma generating unit 30 into the vacuum chamber 10 such that an appropriate steady state pressure within the vacuum chamber 10 can be kept. The flow conductance property of the barrier 34 is determined by selection of appropriate geometrical parameters (e.g. length, diameter) in order to provide the desired steady state pressure of the vacuum chamber under pressure difference conditions relative to the plasma generating unit connected thereto.

Figure 1B:
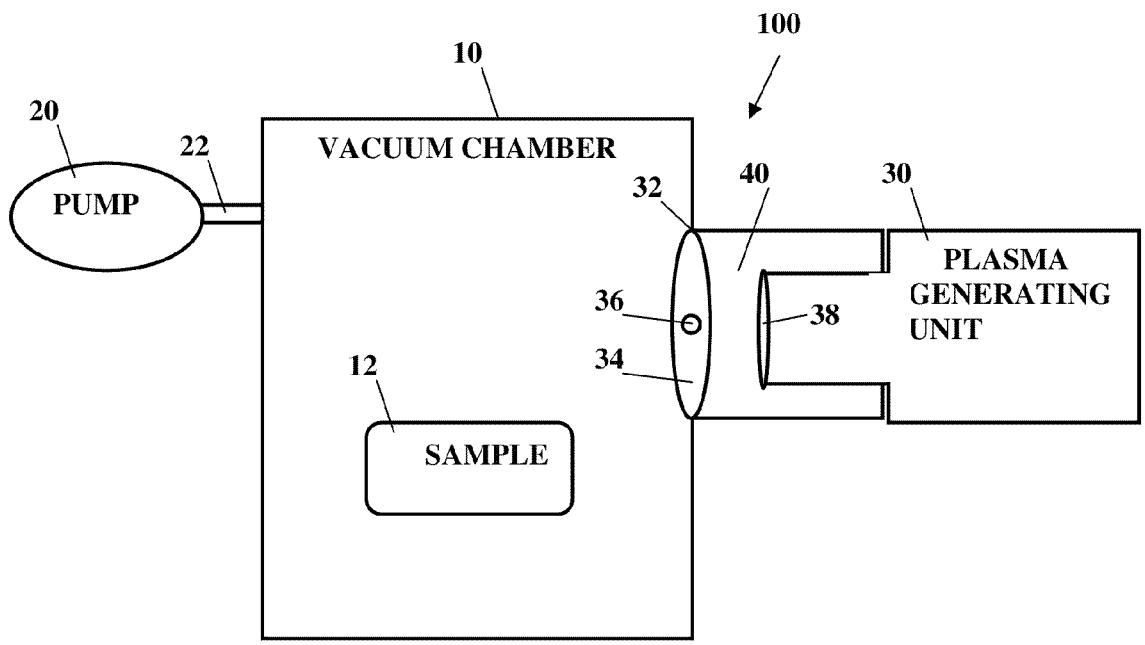
FIG. 1B shows more specifically the function of the connection channel between the plasma generating unit and the vacuum chamber.

A processing system 100 according to some embodiments of the present invention is illustrated in FIG. 1B showing more specifically an example of the configuration of the plasma connecting port 32. As shown, the plasma connection port 32, having a flow input constituted by the output 38 of the plasma generating unit and a flow output constituted by aperture 36 in the barrier 34 at the input to the vacuum chamber 10, actually presents an additional effective flow volume 40 between the plasma generating unit 30 and the vacuum chamber 10. This additional volume 40 together with the appropriately configured barrier 34 provide the ability to control and limit material flow into the vacuum chamber 10 and thus to maintain a desired operational pressure therein. As will be described below, with reference to equations 1-4, material is flowing from the plasma generating unit 30 into the additional volume 40 through output aperture 38 of the plasma generating unit 30, and from this additional volume into the vacuum chamber 10. The inlet and output apertures 38 and 36 of the flow volume 40 have a certain flow conductance which affects the material flow and operation of the pump 20 at the vacuum chamber; thus enabling pressure variations at opposite sides of the aperture. Thus, by appropriately selecting parameters of the barrier 34 to provide desired flow conductance, a desired steady state pressure can be maintained in the vacuum chamber 10.

Figure 2:
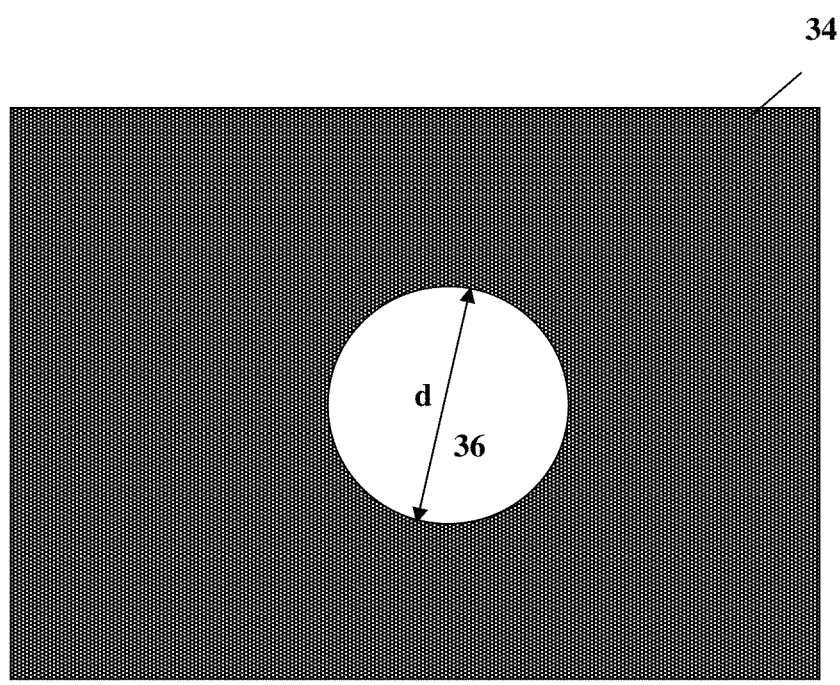
FIG. 2 more specifically illustrates an example of a barrier used in the system of the invention configured to provide desired flow conductance between the plasma generating unit's output and the vacuum chamber.

Reference is made to FIG. 2 illustrating a plate-like barrier 34, preferably made of appropriate electrically-conductive material such as stainless steel or other metal(s), configured with an aperture/perforation 36 having a cross-sectional dimension (diameter) d. The diameter d of the barrier 34 is selected according to a given pressure or pressure range in the plasma generating unit 30 and the desired steady state pressure or pressure range in the vacuum chamber 10 defining appropriate pressure difference at the plasma connection port 32.

The selection of parameter(s) of the barrier (e.g. geometrical parameter as well as electrical conductivity) is/are derived from a desired steady state pressure to be obtained in the vacuum chamber 10. In this connection, the following should be understood. The number of particles leaving the vacuum chamber 10 is determined by a product $P_c \cdot S$, where $P_c$ is the working pressure inside the chamber 10 and S is the pumping speed of gas (air) pumped by vacuum pump 20 through the connection port 22 between the chamber 10 and the pump 20.

In the steady state, substantially the same number of particles enter the chamber 10 through the plasma connection port 32, which is in turn determined, in steady state condition by a product $(P_p - P^*) \cdot C_p$, where $P_p$ is the working pressure in the plasma generating unit 30 and P* is the pressure in the volume 40 created between the plasma generating unit and the vacuum chamber 10 (by the aperture barrier 34), and $C_p$ is a flow conductance of the output 38 of the plasma generating unit 30. Thus, when the system is in steady state, the desired working pressure $P_c$ in the vacuum chamber 10 is determined by the following relation/equation:

$$P_c \cdot S = (P_p - P^*) \cdot C_p \quad \text{(equation 1)}$$

The pressure P* in the additional volume between the barrier and the plasma generating unit is determined by equation 1 to be $$P^* = P_p - P_C \cdot S / C_p \quad \text{(equation 2)}$$

Additionally, in steady state conditions, similar relation is kept between the vacuum chamber 10 and the additional volume 40, giving:

$$P_C \cdot S = (P^* - P_C) \cdot C \quad \text{(equation 3)}$$

where C is the flow conductance of the barrier.

The desired flow conductance of the barrier 34 is given by combining equations 2 and 3 to be:

$$C = \frac{S \cdot P_C \cdot C_P}{P_P \cdot C_P - P_C \cdot (S + C_P)} \quad \text{(equation 4)}$$

Equation 4 indicates that by varying the flow conductance C of the barrier 34, desired steady state working pressure of the vacuum chamber 10 can be maintained, allowing a pressure difference between the output of the plasma generating unit 30 and the vacuum chamber 10. It should be noted that the conductance C is determined by geometrical properties of the barrier 34 as well as thermodynamic properties of the gas (air plasma, oxygen radicals) passing therethrough and may also be dependent on the pressure values. Thus, practically, the geometrical parameter(s) of the barrier are selected for given thermodynamic properties of the gas and given pressure values as used in the system.

As seen from equation (1), and keeping in mind that the working pressure $P_c$ of the vacuum chamber 10 is typically much lower than the output pressure $P_p$ of the plasma generating unit 30 (e.g. they differ by two or more orders of magnitude), a ratio between the flow conductance C of the barrier 34 and the pumping rate S may at times be approximated as a ratio between the working pressure $P_c$ and the output pressure $P_p$. For example, in order for a vacuum chamber to operate with working pressure of $10^{-6}$ Torr, while the chamber is connected to a pump operating with pumping rate of 200 L/s and is connected to a plasma generating unit with output pressure of $10^{-3}$ Torr, the flow conductance of the barrier at the plasma connection port should be about 0.2 L/s. If the output pressure of the plasma generating unit is higher, the flow conductance of the barrier should accordingly be lower.

Considering that the pressure in the vacuum chamber of a typical SEM is $(1-5) \times 10^{-6}$ Torr, and that typical output pressure of the plasma generating unit is $10^{-3}$ Torr, the inventors have found that a barrier in the form of an aperture of a diameter of about 0.2-1 millimeter within a metallic plate, can provide desired flow conductance corresponding to the desired steady state of the system operation. Thus, the conductance of the barrier may be selected to approximately satisfy the relation:

$$C \approx S \cdot P_c / P_p \quad \text{(equation 5)}$$

It should be noted that equation 5 is an approximation based on relatively high pressure difference, i.e. assuming that the pressure in the plasma generating unit is much higher than the desired steady state working pressure in the vacuum chamber, and the exact desired value of the flow conductance of the barrier can be directly derived from equation 4 above. More specifically, the above approximation may be valid since the working pressure $P_c$ of the chamber 10 may be smaller by approximately three orders of magnitude relative to the output pressure $P_p$ of the plasma generating unit 30, However the pumping rate S of the pump 20 may be three orders of magnitude higher than the conductance $C_p$ of the output 38 of the plasma generating unit 30. In such cases the approximation shown in equation 5 is not valid and the flow conductance C of the barrier should be selected according to equation 4.

The flow conductance of a circular aperture at low pressure conditions, i.e. assuming laminar material flow through the aperture and neglecting interactions between different particles, depends mainly on the diameter D of the aperture and the average velocity $v_{ave}$ of the material flow. This gives the relation:

$$C = v_{ave} \cdot \pi \cdot D^2 / 4 \quad \text{(equation 6)}$$

The average material velocity can be determined in accordance with the material mass and temperature. For air plasma at temperature of about 300° K, the average material velocity is of the order of 470 m/s depending on the specific material/particles. More specifically, oxygen molecules at 300° K have average velocity of 445 m/s, while nitrogen molecules have average velocity of about 476 m/s. It should be noted that this average velocity also determines the flow conductance $C_p$ at the output of the plasma generating unit 30 which may be used to calculate the exact desired value for barrier flow conductance, and accordingly the size of the aperture in the barrier.

Figure 3A:
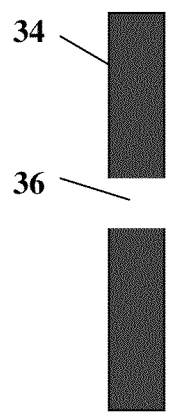
FIGS. 3A-3D exemplify four aperture configurations through the barrier plate which can be used in the technique of the present invention.
Figure 3B:
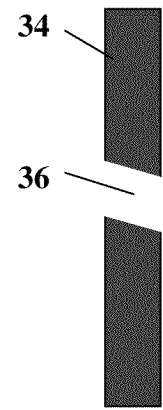
Figure 3C:
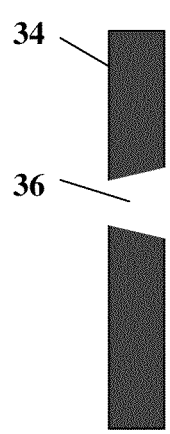
Figure 3D:
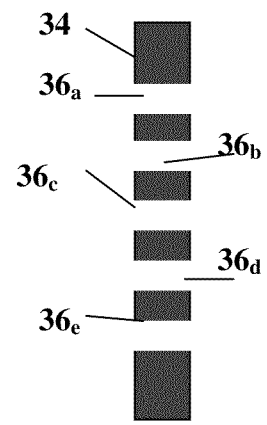

Reference is made to FIGS. 3A-3D illustrating several configurations of the aperture(s)/perforation(s) 36 in barrier plate 34. FIG. 3A illustrates a cylindrical-like horizontal perforation 36; FIG. 3B illustrates an angled (non-horizontal) cylindrical perforation 36; FIG. 3C illustrates a barrier plate 34 with perforation 36 of varying diameter; and FIG. 3D illustrates a barrier plate 34 with multiple perforations, five such perforations $36_a$-$36_e$ are shown in this non limiting example. It should be noted that the geometrical parameters of the barrier plate 34, and in particular of the one or more apertures/perforations 36 of the barrier 34, are selected to provide a desired flow conductance as described above. It should be noted that equation 6 above describes flow conductance for laminar flow through a short cylindrical aperture. By providing the barrier plate 34 as a thick plate, i.e. such that the aperture 36 is in the form of a tube (as in FIG. 3A) or even a tube with no strait path (as in FIG. 3B) the flow conductance for a given aperture will be lower. Additionally, designing the aperture 36 with a varying diameter (as in FIG. 3C), may provide high obstruction of charged particles while maintaining flow conductance for radicals (electrically neutral). Moreover, according to some embodiments the barrier plate 34 may include several apertures, five such apertures $36_a$-$36_e$ are shown in FIG. 3D. The plurality of apertures 36 in the barrier plate 34 should preferably be designed such that the total flow conductance provides the desired appropriate flow conductance as described above. Such configuration of the barrier plate may provide efficient blockage of charged particles due to the large area in which that particles may interact with the plate material.

As indicated above, the barrier of the invention can also be utilized to eliminate or substantially reduce the charged particles passage from the plasma generating unit into the vacuum chamber. Such charged particles (electrons and/or ions) may cause electrical problems when interacting with electronic devices operating within the vacuum chamber. To achieve this goal, the inventors have constructed the barrier from an electrically conductive material, while the barrier is electrically grounded during the system operation. Charged particles, i.e. electrons and/or ions, generated by the plasma generating unit and escaping therefrom together with the desired radicals, are thus captured by the electrically conductive barrier. This eliminates, or at least significantly reduces, transfer of charged particles into the vacuum chamber. This effect of the electrically grounded barrier provides protection to various electronic elements which may be placed inside the vacuum chamber and are used for operating different processes therein.

Figure 4:
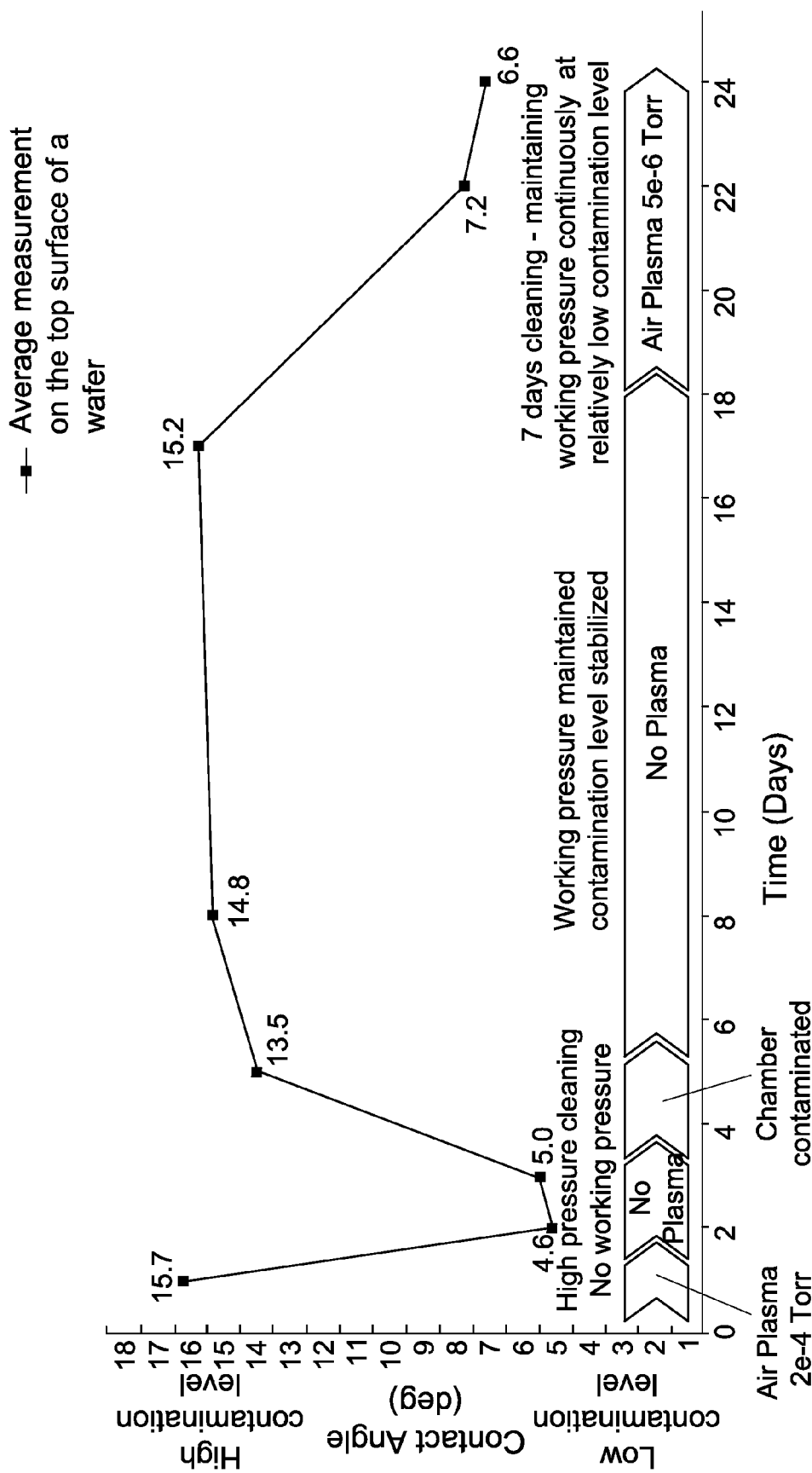
FIG. 4 shows measurement results for the contact angle corresponding to a degree of contamination of a sample after being inspected in a vacuum chamber.

It should be understood that the provision of the barrier configured as described above might reduce the flow of radicals into the vacuum chamber and thus increase the time required for cleaning of the vacuum chamber from HC molecules. However, the provision of appropriately designed barrier enables continuous cleaning of the vacuum chamber without a need to stop the processes operating therein for the cleaning period. In this connection, reference is made to FIG. 4 illustrating the contact angle measurements which correspond to the amount of HC contaminates within a vacuum chamber. The contact angle measurement is known per se and is based on measuring an angle created by a drop of water (or other liquid) located on a surface of a sample. A surface contaminated by HC molecules becomes more hydrophobic and thus the contact angle is larger. FIG. 4 shows contact angle measurements on the top surface of a semiconductor sample after being located in a vacuum chamber of a SEM inspection tool for a time period similar to the time needed for conventional inspection process, typically a few hours. The measurement set up is as follows: a vacuum chamber, of the kind used for SEM metrology was used as a "dummy chamber" i.e. not equipped for carrying out any metrology, inspection or other process. However certain equipment, such as Cables which are known to contribute contaminants, was placed inside the chamber. A Silicon wafer was placed inside the chamber through a transfer unit of the kind used in SEM metrology systems and was left inside the chamber for two hours. Later, the wafer is transferred out of the chamber for the purpose of contamination measurements performed outside of the chamber. The chamber was maintained at working pressure ($10^{-6}$ Torr) during the entire experiment period, except during the period of cleaning utilizing the conventional techniques, in which the pressure was increased to the level of $2.10^{-4}$ Torr. The first measurement (day 1) was done on a sample wafer placed in the vacuum chamber before performing any cleaning process, resulting in average contact angle of 15.7°, on the top surface of the wafer, such measurement corresponds to relatively contaminated chamber. The vacuum chamber was then cleaned from HC contaminates using the conventional technique at chamber pressure of $2.10^{-4}$ Torr. After the chamber was cleaned, two additional measurements were made showing the efficiency of the cleaning process, providing the contact angle results of 5.5° (day 2) and 5.8° (day 4) respectively.

After cleaning of the chamber using the conventional techniques, vacuum at process level ($10^{-6}$ Torr) was resumed and as in common operation, the chamber was allowed to contaminate again, as a result of outgassing of contaminants from the cables. This is reflected in additional three measurements that were made in days 5, 8 and 17, giving results of 13.5°, 15° and 15.2° contact angles. Then, at day 17, the chamber was cleaned utilizing the technique of the present invention, which is this non-limiting case was done using Oxygen radicals. A metallic barrier, as shown in FIG. 2, including an aperture of 1 millimeter in diameter, was placed between the plasma generating unit and the plasma connection port of the vacuum chamber. The metallic plate was grounded to collect charged particles, and the aperture provided for maintaining appropriate flow rate between the plasma generating unit output and the vacuum chamber, and thus maintain vacuum chamber in working pressure. The cleaning process according to the invention was done during days 17 to 24, while a pressure in the vacuum chamber was $5.10^{-6}$ Torr (which is actually a working pressure for most processes carried out in such vacuum chambers) and charged particles generated in the plasma generating unit were captured by the metallic barrier and prevented from entering the chamber. During the cleaning process (in days 22 and 24), two additional measurements of the contact angle were made: 7.2° and 6.6°. These measurements correspond to successive reduction in the degree of contamination: the vacuum chamber is becoming less and less contaminated by HC molecules. As noted above, although the cleaning process utilizing the technique of the invention is somewhat slower and takes longer time (few days versus few hours), it allows cleaning the chamber without a need to stop the operation of various processes inside the chamber, such as SEM inspection of a sample.

Typically, when utilizing the conventional cleaning techniques, i.e. to perform plasma at higher pressure, some key sub-systems need to be shut down, and turned on at the end of the cleaning, requiring recovery period. This is eliminated by the technique of the present invention, as the working pressure can be maintained. Depending on the specific process to be carried out in vacuum, the cleaning process utilizing the present invention can be integrated with the operation of the system. In other words, the invention provides a so-called on-line cleaning rather than typical off-line one.

Thus, the technique of the present invention provides for efficient cleaning of a vacuum chamber from Hydrocarbon contaminator while enabling continuous operation of operational processes (e.g. sample inspection) in the chamber, and eliminates, or at least significantly reduces, interaction between charged particles and electronic devices within the chamber.

The invention claimed is:
1. A method for use in cleaning of a vacuum chamber configured for operating at a micro-Torr pressure range, the method comprising:
   connecting the vacuum chamber to a plasma generating unit via a plasma connection port and to a pumping unit via a pumping port, and controlling a flow conductance for charged particles and cleaning substances produced in the plasma generating unit through the plasma connection port into the vacuum chamber, wherein said controlling comprises providing in said plasma connection port a barrier plate having at least one aperture and maintaining a working pressure at a micro-Torr range inside the vacuum chamber that is lower than a pressure in the plasma generating unit while cleaning the vacuum chamber by said cleaning substances, and said maintaining comprises selecting a dimension of the at least one aperture.

2. The method of claim 1, wherein said controlling of the flow conductance for the charged particles and cleaning substances comprises determining a steady state pressure difference between the working pressure of the vacuum chamber and the pressure in the plasma generating unit.

3. The method of claim 2, comprising selecting an electrically conductive material composition and electrical condition for said barrier plate to thereby substantially prevent propagation of the charged particles into the vacuum chamber.

4. The method of claim 2, wherein the dimension of said aperture is between 1 to 3 millimeters.

5. The method of claim 1, comprising continuously operating the vacuum chamber under said working pressure for performing one or more processes in the vacuum chamber, and operating the plasma generating unit and the pumping unit for cleaning said vacuum chamber by the cleaning substances flowing into the vacuum chamber from the plasma generating unit.

6. The method of claim 1, comprising operating the pumping unit for evacuating said vacuum chamber at a certain pumping rate S, and selecting the flow conductance of the plasma connection port such that a ratio between said flow conductance and said pumping rate is substantially similar to a ratio between the working pressure in said vacuum chamber and the pressure in said plasma generating unit.

7. A system for cleaning a vacuum chamber configured for operating at a micro-Torr pressure range by carrying out the method of claim 1, the system comprising:

a plasma generating unit connectable to the vacuum chamber via a plasma connection port; and a pumping unit connected to the vacuum chamber via a pumping port, said plasma connection port comprising a barrier plate comprising at least one aperture having a preselected dimension for controlling a flow conductance through the plasma connection port to the vacuum chamber for charged particles and cleaning substances produced in the plasma generating unit, to thereby maintain a predetermined working pressure at a micro-Torr range inside the vacuum chamber while cleaning the vacuum chamber by said cleaning substances, wherein said barrier plate has one or more selected parameters such that said flow conductance provides a steady state of the working pressure in the vacuum chamber, and said one or more parameters comprise at least the dimension of the at least one aperture in the barrier plate to determine a flow rate for the cleaning substances into the vacuum chamber, and the dimension of said aperture is in a range of about 0.3-1 millimeters, the working pressure being in a micro-Torr range and the pressure in the plasma generating unit being at least in a mili-Torr range.

8. The system of claim 7, wherein said barrier plate is made of a selected electrically conductive material composition and has a predetermined electrical condition to thereby substantially prevent propagation of the charged particles into the vacuum chamber.

9. The system of claim 7, wherein said barrier plate is an electrically grounded metallic plate with the aperture therein.

10. The system of claim 7, wherein said barrier plate is installed across the plasma connection port.

11. The method of claim 1, wherein said selecting the dimension of the at least one aperture in the barrier plate comprises selecting an appropriate aperture diameter to allow a suitable pressure difference between the vacuum chamber and the plasma generating unit such that the output pressure of the plasma generating unit is adequate to sustain the working pressure in the vacuum chamber while being evacuated by the pumping unit.

* * * * *